(12) United States Patent
Felts

(10) Patent No.: US 6,180,191 B1
(45) Date of Patent: Jan. 30, 2001

(54) METHOD FOR PLASMA DEPOSITION OF A THIN FILM ONTO A SURFACE OF A CONTAINER

(75) Inventor: John T. Felts, Alameda, CA (US)

(73) Assignee: Nano Scale Surface Systems, Inc., Alameda, CA (US)

( * ) Notice: Under 35 U.S.C. 154(b), the term of this patent shall be extended for 0 days.

(21) Appl. No.: 09/187,531

(22) Filed: Nov. 5, 1998

Related U.S. Application Data

(62) Division of application No. 08/728,283, filed on Oct. 8, 1996, now Pat. No. 6,112,695.

(51) Int. Cl.$^7$ ...................................................... H05H 1/24

(52) U.S. Cl. .......................... 427/569; 427/578; 427/237; 427/238

(58) Field of Search .................................... 427/569, 578, 427/579, 237, 238

(56) References Cited

U.S. PATENT DOCUMENTS

| | | |
|---|---|---|
| 3,947,617 | 3/1976 | Gerek et al. . |
| 3,951,711 | 4/1976 | Snyder . |
| 4,049,842 | 9/1977 | Gerek et al. . |
| 4,137,365 | 1/1979 | Wydeven et al. . |
| 4,292,342 | 9/1981 | Sarma et al. . |
| 4,444,973 | 4/1984 | Schönfelder et al. . |
| 4,478,874 | 10/1984 | Hahn . |
| 4,487,161 | 12/1984 | Hirata et al. . |
| 4,552,791 | 11/1985 | Hahn . |
| 4,686,113 | 8/1987 | Delfino et al. . |
| 4,735,832 | 4/1988 | Ichikawa et al. . |
| 4,746,538 * | 5/1988 | Mackowski .............................. 427/38 |
| 4,764,405 | 8/1988 | Bauman et al. . |
| 4,809,876 | 3/1989 | Tomaswick et al. . |
| 4,824,444 | 4/1989 | Nomura . |
| 4,869,203 | 9/1989 | Pinkhasov . |
| 4,880,675 | 11/1989 | Mehta . |
| 4,883,686 | 11/1989 | Doehler et al. . |
| 5,113,790 | 5/1992 | Geisler et al. . |
| 5,224,441 | 7/1993 | Felts et al. . |
| 5,272,417 | 12/1993 | Ohmi . |
| 5,308,649 * | 5/1994 | Babacz ................................ 427/562 |
| 5,330,578 | 7/1994 | Sakama et al. . |
| 5,364,665 | 11/1994 | Felts et al. . |
| 5,378,510 | 1/1995 | Thomas et al. . |

(List continued on next page.)

FOREIGN PATENT DOCUMENTS

| | | |
|---|---|---|
| 95100847 | 8/1995 | (EP) . |
| WO 95/21948 | 8/1995 | (WO) . |
| WO 95/22413 | 8/1995 | (WO) . |
| WO 98/40531 | 9/1998 | (WO) . |

OTHER PUBLICATIONS

Danielzik, B. et al., "High rate coatings for diffusion barriers by plasma impulse chemical vapour deposition" presented at 39th Annual Technical Conference of the Society of Vacuum Coaters (May 1996) in Philadelphia, Pennsylvania.

(List continued on next page.)

*Primary Examiner*—Shrive Beck
*Assistant Examiner*—Bret Chen
(74) *Attorney, Agent, or Firm*—Gunnison, McKay & Hodgson, L.L.P.; Serge J. Hodgson

(57) ABSTRACT

A gas inlet, which also serves as a counter electrode, is located inside of a vacuum chamber made of an electrically insulating material. A container is mounted on a mandrel mounted on the gas inlet. The chamber is evacuated to a subatmospheric pressure. A process gas is then introduced into the container through the gas inlet. The process gas is ionized by coupling RF power to a main electrode located adjacent an exterior surface of the chamber and to the gas inlet which deposits a plasma enhanced chemical vapor deposition (PECVD) thin film onto the interior surface of the container.

24 Claims, 3 Drawing Sheets

U.S. PATENT DOCUMENTS

| | | |
|---|---|---|
| 5,434,008 | 7/1995 | Felts . |
| 5,439,736 | 8/1995 | Nomura . |
| 5,443,645 | 8/1995 | Otoshi et al. . |
| 5,449,432 | 9/1995 | Hanawa . |
| 5,468,520 | 11/1995 | Williams et al. . |
| 5,470,388 | 11/1995 | Goedicke et al. . |
| 5,521,351 | 5/1996 | Mahoney . |
| 5,531,060 | 7/1996 | Fayet et al. . |
| 5,545,375 | 8/1996 | Tropsha et al. . |
| 5,554,223 | 9/1996 | Imahashi . |
| 5,565,248 | 10/1996 | Plester et al. . |
| 5,569,810 | 10/1996 | Tsuji . |
| 5,571,366 | 11/1996 | Ishii et al. . |
| 5,620,523 | 4/1997 | Maeda et al. . |
| 5,652,030 * | 7/1997 | Delperier et al. .................... 427/585 |
| 5,677,010 * | 10/1997 | Esser et al. .......................... 427/489 |
| 5,679,412 * | 10/1997 | Kuehnle et al. ..................... 427/534 |
| 5,690,745 * | 11/1997 | Grunwald et al. ........... 118/723 MW |
| 5,779,849 | 7/1998 | Blalock . |

OTHER PUBLICATIONS

Felts, J. et al., "Commercial–scale application of plasma processing for polymeric substrates: From laboratory to production", *J. Vac. Sci. Technology* 10:1675–1681 (1992).

Heil, R., "Mechanical Properties of PECVD Silicon–Oxide Based Barrier Films on PET" *1995 Society of Vacuum Coaters* 33–39 (1995).

Jansen, F., "Thin Film Deposition On Inside Surfaces By Plasma Enhanced Chemical Vapor Deposition" presented at the 41st American Vacuum Society National Symposium, Denver, Colorado (Aug. 1994) no page numbers.

Knoll, R. et al., "Effects of Polymer Surface Characteristics on the Performance of PECVD Oxide Barrier Films" presented at 39th Annual Technical Conference of the Society of Vacuum Coaters (May 1996) in Philadelphia, Pennsylvania no page numbers.

Knoll, R. et al., "Effects of Process Parameters on PECVD Silicon Oxide and Aluminum Oxide Barrier Films" *1995 Society of Vacuum Coaters* 425–431 (1995).

* cited by examiner

METHOD FOR PLASMA DEPOSITION OF A THIN FILM ONTO A SURFACE OF A CONTAINER

This application is a divisional of application Ser. No. 08/728,283, filed Oct. 8, 1996 now U.S. Pat. No. 6,112,695.

FIELD OF THE INVENTION

The present invention relates generally to plasma processing and in particular to a method and apparatus for plasma enhanced chemical vapor deposition of a thin film onto the interior surface of a container.

BACKGROUND OF THE INVENTION

Traditionally, containers for chemically sensitive materials have been made from inorganic materials such as glass. Glass containers offer the advantage that they are substantially impenetrable by atmospheric gases and thus provide a product with a long shelf life. Glass containers are also readily recyclable. However, glass containers are heavy and expensive to manufacture.

More recently, lighter and less expensive containers made of polymeric materials are being used in applications where traditionally glass containers were used. These polymeric containers are less suspectable to breakage, are less expensive to manufacture, are lighter and less expensive to ship than glass containers. Further, polymeric containers can be made transparent thus allowing the contents of the container to be readily viewed by a consumer before the product is purchased.

However, polymeric containers are not without disadvantages. One significant disadvantage is that polymeric containers are ordinarily highly permeable to gases. This high permeability to gases allows atmospheric gases to pass through the polymeric container to the packaged product and also allows gases in the packaged product to escape through the polymeric container, both of which undesirably degrade the quality and shelf life of the packaged product.

One approach to decrease the gas permeability of polymeric containers is to form a multilayered polymeric container which includes at least one low gas permeable polymeric layer along with at least one other polymeric layer. However, such an approach is relatively complicated, costly and often produces a container which is difficult to recycle.

Another approach to decrease the gas permeability of polymeric containers is to deposit a barrier coating, i.e. a coating having a substantial resistance to the permeation of gaseous or volatile material, on the polymeric container. To date however, there are several obstacles which have prevented barrier coated polymeric containers from gaining wide acceptance.

One obstacle which has inhibited the use of barrier coated polymeric containers is that conventional barrier coating deposition techniques are not well suited for mass production. To illustrate, in Thomas et al., U.S. Pat. No. 5,378,510 a method and apparatus for depositing barrier coatings on the interior surface of a polymeric container is presented. However, in Thomas et al., a tubular plasma chamber 46 with downstream extension 52, adaptor 50, tube 54 and coaxial conduit are employed to convert an oxidizing gas into a plasma and to deliver the activated oxidizing gas species separately from organosilicon vapor to the vicinity of the article to be coated (see col. 6, lines 46–67 and FIG. 1). Thus, although Thomas et al. demonstrates the feasibility of depositing a barrier coating on an article, the tubular plasma chamber and associated equipment are relatively expensive and complex and thus are not well suited to the production environment.

Another obstacle which has inhibited the use of barrier coated polymeric containers is the difficulty associated with depositing a uniform barrier coating. Generally, it is preferable to deposit a uniform barrier coating on the polymeric container to ensure that the entire polymeric container provides an effective gas permeation barrier.

One conventional technique to improve the uniformity of the deposited barrier coating is to rotate the container during processing. To illustrate, in Thomas et al. at col. 9, lines 14–20 the polymeric container is rotated during the deposition of the barrier coating to promote the even distribution of the barrier coating on the interior surface of the polymeric container. However, as rotation of the polymeric container is accomplished using an additional motor which rotates a shaft extending into the chamber through an air to vacuum feedthrough, rotation of the polymeric container further increases the cost and decreases the reliability of the barrier coating deposition process.

Accordingly, the art needs a simple, inexpensive and reliable process for depositing a barrier coating on a polymeric container. The process should have a fast cycle time to accommodate production demands. Further, the barrier coating deposited should have good uniformity without the necessity of rotating the polymeric container and the barrier coated polymeric container should be readily recyclable.

SUMMARY OF THE INVENTION

In accordance with the present invention, a method and apparatus for depositing a thin film onto a surface of a container is presented.

The apparatus includes a chamber made of an electrically insulating material. Located adjacent an exterior surface of the chamber is a main electrode. Extending into the chamber is a counter electrode which is a hollow tube that also serves as a gas inlet.

The chamber is sealed on a first end with a chamber door and on a second end with a face plate. The face plate is fitted with a vent port capable of being connected to a vent valve and with a pressure port capable of being connected to a pressure measuring device.

The apparatus further includes a pumping plenum attached on a first end to the face plate and a T-coupler attached on a first end to a second end of the pumping plenum. The counter electrode extends through the pumping plenum and through the T-coupler. A vacuum seal is formed between the counter electrode and a second end of the T-coupler. The T-coupler is made of an electrically insulating material thus electrically isolating the counter electrode from the pumping plenum, the face plate and the chamber.

Also coupled to the T-coupler is a vacuum pump which is capable of creating a vacuum inside of the chamber.

The face plate also has a gas inlet port connected to a first process gas source. A first flow controller is coupled between the gas inlet port and the first process gas source. The first flow controller has the capability of controlling the flow of gas from the first process gas source to the chamber.

Connected to the counter electrode is a second process gas source. The second process gas source includes a first gas component source and a second gas component source. To control the flow of gas from the first gas component source to the counter electrode, a second flow controller is coupled between the counter electrode and the first gas component source.

The second gas component source is a container of organosilicon liquid. A vaporizer/flowcontroller system (VF system) is provided to vaporize the organosilicon liquid into organosilicon vapor and to control the flowrate of the organosilicon vapor generated. The VF system includes a first valve, a second valve and a capillary tube coupled on a first end to the first valve and on a second end to the second valve. The capillary tube has an inside diameter typically in the range of 0.001 inches to 0.010 inches. The first valve is also coupled to the counter electrode and the second valve is also coupled to a liquid line which is inserted into the container of organosilicon liquid.

Also connected to the counter electrode is a pressurized gas source. By opening an ejection shutoff valve connected between the pressurized gas source and the counter electrode, the counter electrode is flushed with compressed gas.

The main electrode and counter electrode are powered by an alternating current (AC) power supply which preferably has an output frequency of 13.56 megahertz (MHz).

To allow a container to be readily mounted in the chamber, a mandrel is mounted on the counter electrode. The mandrel has a lip on to which the container can be mounted. Extending through the mandrel are one or more gas outlet ports which allow process gas to flow from the interior to the exterior of the container.

Mounted on a first end of the counter electrode is a gas nozzle. The gas nozzle has an inside diameter larger than an outside diameter of the counter electrode thus allowing a portion of the counter electrode to fit inside of the gas nozzle.

In accordance with the present invention, a method for depositing a coating on the interior surface of a container is also presented. The method includes mounting the container in the chamber and then evacuating the chamber. A first process gas is introduced into a first region exterior to the container and a second process gas is introduced through a gas inlet into a second region interior to the container. The gas inlet also serves as the counter electrode. The first and second process gases are then ionized by coupling AC power, typically RF power, to the main electrode adjacent the exterior surface of the chamber and to the gas inlet to deposit the coating on the interior surface of the container.

In this embodiment, the first process gas is helium and the second process gas is a gas mixture which includes oxygen and an organosilicon vapor. The process gases are ionized for 1 to 300 seconds and typically for 5 to 15 seconds. After the coating is deposited on the interior surface of the container, the chamber is vented and the container is removed.

The deposited coating provides an excellent gas permeation barrier. Further, since the coating is deposited on the interior surface of the container, the coating is not subject to abrasion during shipment and handling of the container as compared to exterior surface of the container. Also, by forming the coating on the interior surface of the container, degradation of the product within the container from direct interactions between the product and the container is prevented.

Further, the coating is uniformly deposited without the necessity of rotating the container. Since the barrier coating is typically 1000 angstroms or less, the barrier coating represents a very small fraction of the material of the container, thus allowing the container to be readily recycled.

The cycle time, typically of 5 to 15 seconds, is well suited for mass production of barrier coated containers. In addition, the apparatus is simple to operate, is relatively inexpensive to manufacture and needs little servicing.

These and other objects, features and advantages of the present invention will be more readily apparent from the detailed description of the preferred embodiments set forth below taken in conjunction with the accompanying drawings.

DESCRIPTION OF THE PREFERRED EMBODIMENTS

In accordance with the present invention, a method and apparatus for plasma enhanced chemical vapor deposition of a thin film onto a surface of a container in presented.

Figure 1:
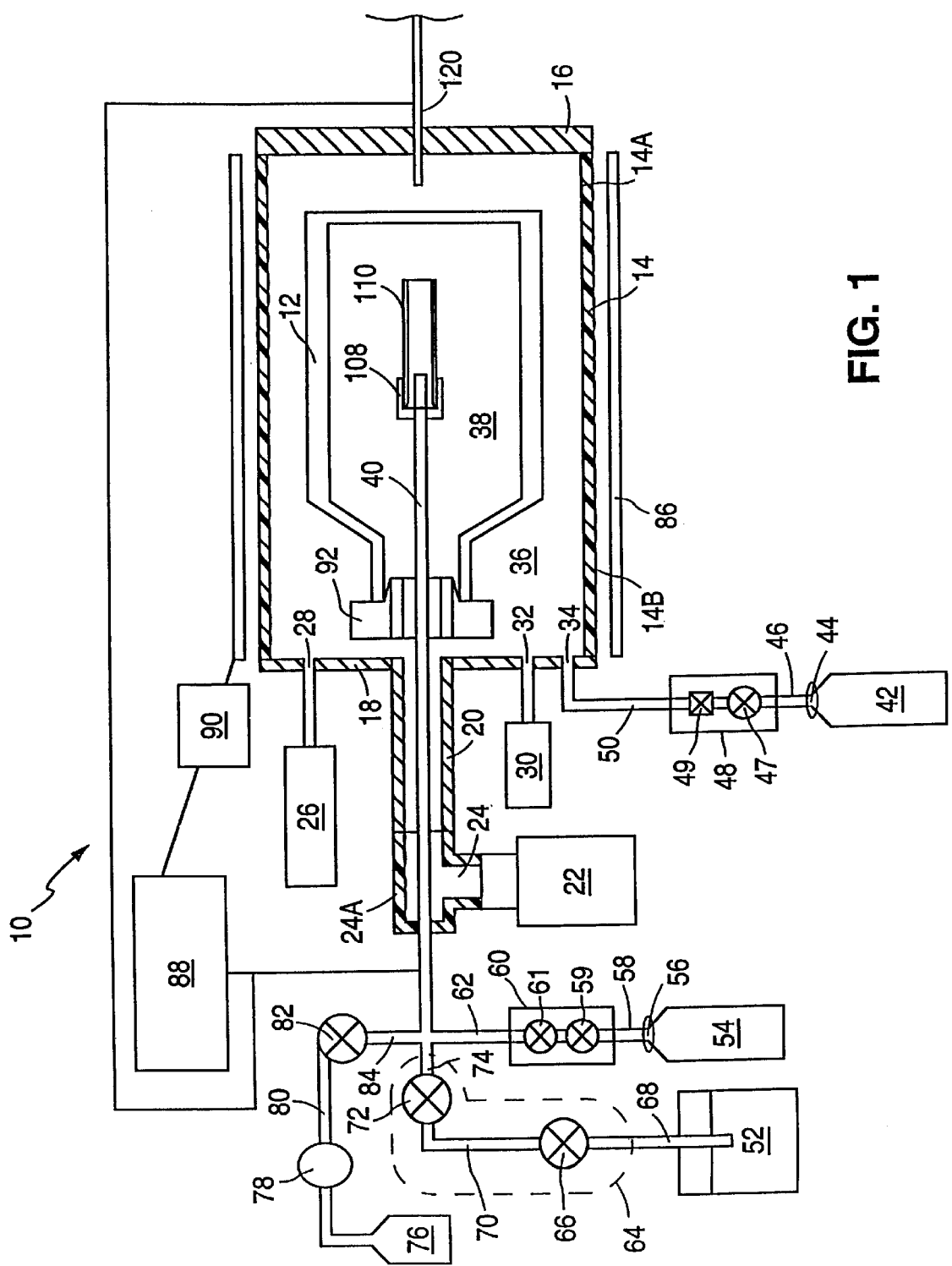
FIG. 1 is a cross-sectional view of a container interior surface coating (CISC) reactor system having a container mounted inside of a cylindrical chamber in accordance with one embodiment of the present invention.

FIG. 1 is a cross-sectional view of a container interior surface coating (CISC) reactor system 10 having a container 12 mounted inside of a cylindrical chamber 14 in accordance with one embodiment of the present invention. Chamber 14 is made of an insulating material such as quartz although other insulating materials such as alumina or plastic can be used.

In this embodiment, the length of chamber 14, i.e. the distance from a first end 14A to a second end 14B of chamber 14, is 8.7 inches (in.) and the inside diameter of chamber 14 is 7.75 in. Generally, the inside diameter of chamber 14 is larger than the largest outside diameter of container 12. Preferably, the inside diameter of chamber 14 is at least 30% larger than the largest outside diameter of container 12.

Chamber 14 is fitted on first end 14A with a door 16 which can be opened and closed to allow access to the interior of chamber 14. When door 16 is closed, i.e. when door 16 is in contact with end 14A as shown in FIG. 1, a vacuum seal is formed between door 16 and second end 14A using conventional means such as by locating an O-ring between door 16 and end 14A. A second end 14B of chamber 14 is vacuum sealed with a face plate 18 also using conventional techniques.

A pumping plenum 20 is concentrically attached on a first end to face plate 18. Pumping plenum 20 is also attached on a second end to a vacuum pump 22 by a T-coupler 24. In this embodiment, vacuum pump 22 is a conventional single or 2-stage rotary type mechanical pump which is set up for oxygen service. (Oxygen service typically requires the use of a fluorinated vacuum pump oil.) T-coupler 24 is made of an electrically insulating material such as teflon or another polymeric material although other electrically insulating materials such as ceramic can be used. T-coupler 24 is a Cole Parmer (Niles, Ill.) part #H-06482-88 Teflon PFA NPT (F) tee or a MDC Vacuum Product, Inc. (Hayward, Calif.) part #728007 PVC Tee with KF50 flanges (part #728007) for nominal 1.5 in. PVC pipe. During use, vacuum pump 22 removes gas from the inside of chamber 14 via pumping plenum 20 and T-coupler 24 thereby reducing the pressure within chamber 14 to a subatmospheric pressure.

The pressure within chamber 14 is measured by a pressure transducer 26 which is exposed to the interior of chamber 14 at a pressure port 28 of face plate 18. Alternatively, a capacitance manometer or a thermocouple gauge can be used in place of pressure transducer 26.

A vent valve 30 is also exposed to the interior of chamber 14 at a vent port 32 of face plate 18. When chamber 14 is at a subatmospheric pressure, vent valve 30 can be opened allowing air to be drawn into chamber 14 through vacuum port 32 thereby bringing the pressure within chamber 14 up to atmospheric pressure. Vent valve 30 can be plumbed (not shown) to an inert gas such as nitrogen thus allowing chamber 14 to be vented with an inert gas.

Process gases can be fed into chamber 14 in at least two locations. In particular, a first process gas is introduced into chamber 14 in a region 36 exterior to container 12 through a gas inlet port 34 of face plate 18. A second process gas is introduced into chamber 14 in a region 38 interior to container 12 through a gas inlet 40.

The first process gas is provided to region 36 from a first process gas source 42 which is typically a standard compressed gas cylinder. Generally, the first process gas has a low mass and a very high ionization potential. In this embodiment the first process gas is helium, although other gases such as hydrogen ($H_2$), argon (Ar), Neon (Ne) or Krypton (Kr) can be used. Source 42 is coupled to gas inlet port 34 via a pressure regulator 44, a gas line 46, a gas flowmeter 48 and a gas line 50.

During use, regulator 44 reduces the pressure of the first process gas (which is at a relatively high pressure inside of source 42) and delivers the first process gas at a reduced pressure to gas line 46. The first process gas flows from regulator 44 through gas line 46 to gas flowmeter 48.

Gas flowmeter 48 functions to control the on/off flow of the first process gas and also functions to control the volumetric flow rate of the first process gas to chamber 14. In this embodiment, gas flowmeter 48 includes a conventional shutoff valve 47 (such as a ball valve) which is the on/off control for the first process gas and a conventional metering valve 49 (such as a needle valve) which controls the flowrate of the first process gas. During use, shutoff valve 47 is opened thereby allowing the first process gas to flow to metering valve 49. Metering valve 49 is adjusted manually to increase or decrease an internal orifice of metering valve 49 thereby to increase or decrease, respectively, the volumetric flow rate of the first process gas. From flowmeter 48 (metering valve 49), the first process gas flows through gas line 50 to gas inlet port 34 and into region 36.

In this embodiment, the second process gas is a gas mixture having a first gas component provided from source 54 and a second gas component provided from source 52. Source 52 is a container of organosilicon liquid. Suitable organosilicon liquids include siloxanes such as hexamethyldisiloxane (HMDSO), 1, 1, 3, 3-tetramethyldisiloxane (TMDSO), and octamethylcyclotetrasiloxane; alkoxysilanes such as amyltriethoxysilane, ethyltriethoxysilane, isobutyltriethoxysilane, and tetramethoxysilane; silazanes such as hexamethyldisilazane; and fluorine-containing silanes such as trimethyfluorosilane. The container of source 52 preferably has a cover to prevent contaminants from falling into the reservoir of organosilicon liquid. However, to allow the organosilicon liquid to be removed from source 52 by liquid line 68, air (or another gas such as nitrogen) must be allowed to enter source 52 as the organosilicon liquid is removed. Source 54 is typically a standard compressed gas cylinder.

As shown in FIG. 1, source 54 is coupled to gas inlet 40 via a pressure regulator 56, a gas line 58, a gas flowmeter 60 and a gas line 62. Since source 54 is generally a reactive gas, and typically an oxidizing gas such as oxygen, pressure regulator 56, gas line 58, gas flowmeter 60 and gas line 62 are manufactured to service oxidizing gases as those skilled in the art will understand. During use, regulator 56 reduces the pressure of the first gas component (which is at a relatively high pressure inside of source 54) and delivers the first gas component at a reduced pressure to gas line 58. The first gas component flows from regulator 56 through gas line 58 to gas flowmeter 60. In this embodiment, gas flowmeter 60 is substantially identical to gas flowmeter 48 and functions in a similar manner to control the on/off and volumetric flow of the first gas component to gas inlet 40. In particular, gas flowmeter 60 includes a shutoff valve 59 and a metering valve 61. From flowmeter 60 (metering valve 61), the first process gas flows through gas line 62 to gas inlet 40.

The second gas component is provided to gas inlet 40 from source 52 via a vaporizer/flowcontroller system 64, hereinafter referred to as VF system 64. VF system 64 includes a liquid shutoff valve 66, a metering valve 72 and a capillary tube 70 coupled on a first end to valve 66 and on a second end to valve 72. As shown in FIG. 1, shutoff valve 66 is coupled to the liquid line 68 which extends into the reservoir of organosilicon liquid in source 52. Metering valve 72 is coupled to gas inlet 40 by a gas line 74. Capillary tube 70 has a typical inside diameter in the range of 0.001 in. to 0.010 in. and a typical length in the range of 0.25 in. to 2.0 in.

Although the present invention is not limited by any theory of operation, it is believed that VF system 64 operates as follows. When CISC reactor system 10 is initially setup, capillary tube 70 and liquid line 68 contain air and are at atmospheric pressure. Liquid line 68 is then inserted into the organosilicon liquid reservoir in source 52.

As described in more detail below, chamber 14 is then evacuated by vacuum pump 22 which creates a vacuum in gas inlet 40. Metering valve 72 is then opened slightly, creating a corresponding vacuum in capillary tube 70. Shutoff valve 66 is then opened to draw the organosilicon liquid from source 52 through liquid line 68 into capillary tube 70. The inner diameter and length of liquid line 68 are selected such that, after organosilicon liquid is drawn into capillary tube 70, no air remains in liquid line 68, i.e. that liquid line 68 is filled with purely organosilicon liquid. Preferably, the inner diameter and length of liquid line 68 are less than or equal to 0.125 in. and 3.0 feet, respectively. In one embodiment, the inner diameter and length of liquid line 68 are ⅟₃₂ in. (0.031 in.) and 2.0 feet, respectively.

Metering valve 72 is then shut and then liquid shutoff valve 66 is shut. At this point, liquid line 68 and capillary tube 70 are filled with purely organosilicon liquid (no air). In particular, capillary tube 70 holds a predetermined amount of organosilicon liquid which is determined by the length and inside diameter of capillary tube 70.

As described in more detail below, during processing of container 12, a vacuum is created in gas inlet 40. Metering valve 72 is then opened thereby drawing some of the organosilicon liquid out of capillary tube 70 into the subatmospheric pressure region of gas inlet 40. As the organosilicon liquid is exposed to the subatmospheric pressure, the organosilicon liquid boils thus producing organosilicon vapor. This continues until all of the organosilicon liquid in capillary tube 70 has been converted into organosilicon vapor. Since the amount of organosilicon vapor produced directly depends upon the amount of organosilicon liquid initially present in capillary tube 70 (which is predetermined), a fixed amount of organosilicon vapor is delivered from capillary tube 70. The flow rate at which the organosilicon vapor is delivered is controlled by adjusting metering valve 72.

After the organosilicon liquid in capillary tube 70 is exhausted, metering valve 72 is closed thus leaving a vacuum in capillary tube 70. Liquid shutoff valve 66 is then opened which draws organosilicon liquid from liquid line 68 and source 52 into capillary tube 70, thus refilling capillary tube 70 with the predetermined amount of organosilicon liquid. Liquid shutoff valve 66 is then closed and VF system 64 is ready to deliver another fixed amount of organosilicon vapor to gas inlet 40.

In the above description, valves 49, 61 and 72 are described as metering valves. However, in an alternative embodiment, valves 49 and 61 are replaced with fixed orifices which are sized to provide the predetermined flow of the first process gas and the first gas component, respectively. Also, valve 72 is replaced with a shutoff valve which has a fixed orifice (or in combination with a fixed orifice) which is sized to provide the predetermined flow of the second gas component. Alternatively, flowmeters 48 and 60 can be replaced with electronic mass flow controllers. Further, VF system 64 can be replaced with a conventional vaporizer system.

Also connected to gas inlet 40 is a pressurized gas source 76 such as a tank of compressed air. The pressurized gas source 76 is coupled to gas inlet 40 via a pressure regulator 78, a gas line 80, an ejection shutoff valve 82 and gas line 84. During use, regulator 78 reduces the pressure of the compressed gas and delivers the compressed gas at a reduced pressure to gas line 80. By opening ejection shutoff valve 82, gas inlet 40 is flushed with the compressed gas.

A main electrode 86 is provided adjacent the exterior surface of chamber 14. Main electrode 86 can be fashioned in a variety of shapes. For example, main electrode 86 can be a continuous coil or can be a plurality of separate cylindrical sections. In this embodiment, main electrode 86 is made of copper and is in the shape of a continuous cylinder. To allow main electrode 86 to fit over chamber 14, the inside diameter of main electrode 86 is slightly larger then the outside diameter of chamber 14. Preferably, main electrode 86 fits tightly over chamber 14. In this manner, any gap between main electrode 86 and chamber 14 is minimized and the power coupling efficiency from main electrode 86 to process gas within chamber 14 is maximized.

Main electrode 86 is powered by a conventional power supply 88. Power supply 88 is generally an alternating current (AC) power supply and preferably operates at 13.56 megahertz (MHz) output frequency (typically referred to as a radio frequency or RF power supply). To match the impedance of power supply 88 to the impedance of the process, a matching network 90 is coupled between power supply 88 and main electrode 86. In this embodiment, the output impedance of power supply 88 is 50 ohms and matching network 90 is a conventional LC type matching network. For example, power supply 88 is a 250 watt, 13.56 MHz generator available from RF Plasma Products and matching network 90 is the corresponding matching network also available from RF Plasma Products. To complete the electrical circuit, power supply 88 is also electrically coupled to gas inlet 40 which, in addition to delivering the second process gas to region 38, operates as a counter electrode for power supply 88.

To allow gas inlet 40 to operate as a counter electrode, gas inlet 40 is made of an electrically conductive material. In this embodiment, gas inlet 40 is a hollow stainless steel tube which has an outside diameter of 0.125 in.

Gas inlet 40 extends into chamber 14, and in particular extends through T-coupler 24 and pumping plenum 20, and into region 38. An air to vacuum seal is formed, for example by an O-ring, between T-coupler 24 and gas inlet 40 at a first end 24A of T-coupler 24. Since T-coupler 24 is made of an electrically insulating material, gas inlet 40 is electrically isolated from chamber 14, pumping plenum 20, face plate 18 and the associated components. Further, gas lines 62, 74 and 84 are typically formed from an electrically insulating material such as plastic thus electrically isolating gas inlet 40 from sources 52, 54, 76 and the associated gas delivery systems. However, it is understood that other configurations can be used to electrically isolate gas inlet 40 from sources 52, 54 and 76. As an illustration, gas line 74 can be steel and gas line 68 can be plastic.

Gas inlet 40 is also electrically isolated from container 12 by a mandrel 92 formed of an electrically insulating material. Alternatively, mandrel 92 can be made of an electrically conductive material, although in this case container 12 would have to be made of an electrically insulating material.

Figure 2:
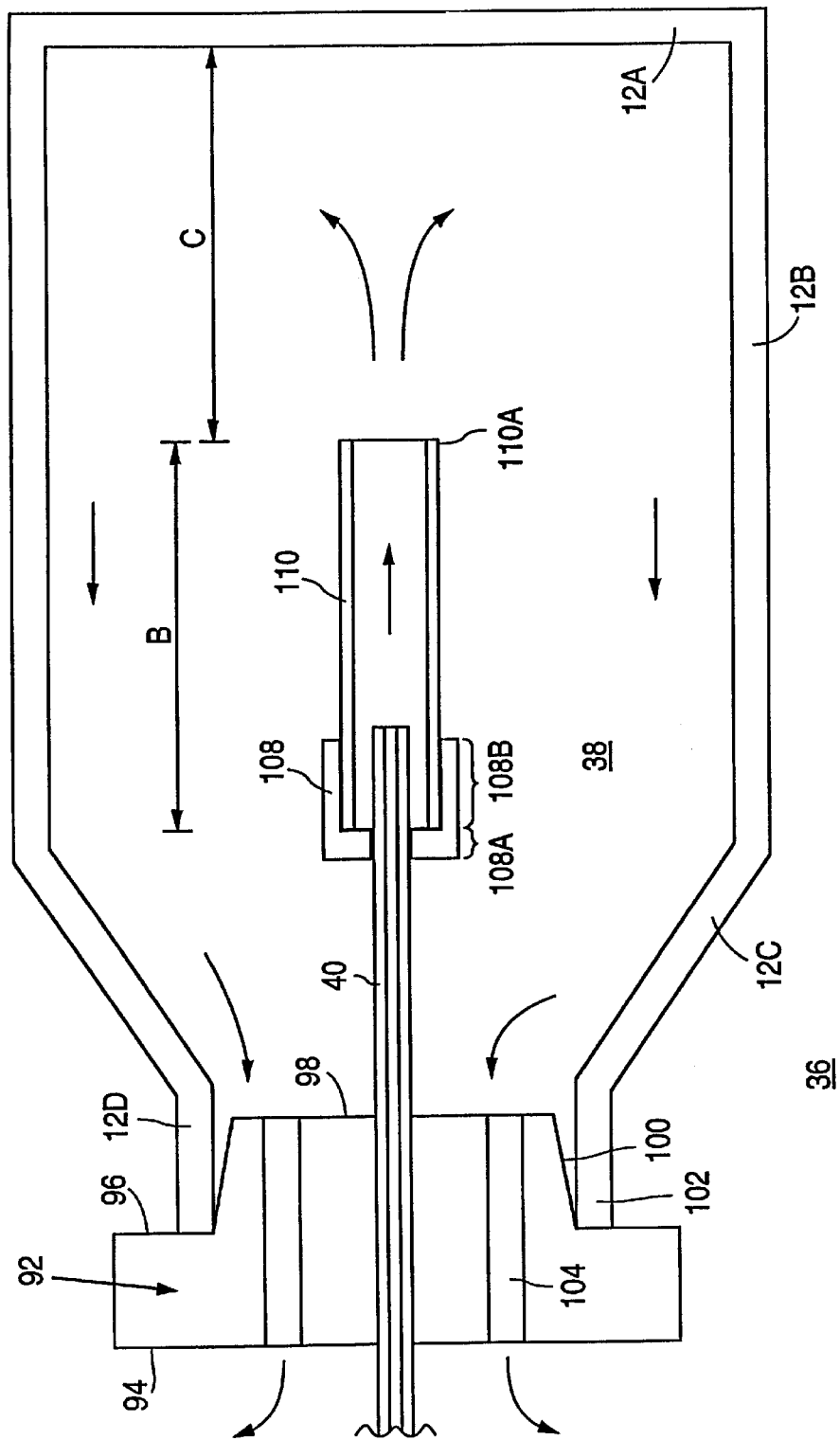
FIG. 2 is an enlarged cross-sectional view of a gas inlet, a mandrel and the container of FIG. 1.

Referring now to FIG. 2, an enlarged cross-sectional view of gas inlet 40, mandrel 92 and container 12 are illustrated. As best seen in FIG. 2, gas inlet 40 extends concentrically through mandrel 92, i.e. extends through the middle of mandrel 92. The diameter of the central aperture through mandrel 92 through which gas inlet 40 extends is slightly larger than the outside diameter of gas inlet 40 to provide a friction fit between mandrel 92 and gas inlet 40. Through this friction fit, mandrel 92 is held in place inside of chamber 14.

Mandrel 92 has a first surface 94 and a second surface 96 opposite first surface 94. A third surface 98 is raised from surface 96 to define a container mounting lip 100. Lip 100 has a taper to allow a friction fit between lip 100 and mouth 102. In particular, lip 100 has a first diameter at surface 98 slightly less than the inside diameter of mouth 102 of container 12 and a second diameter at surface 96 slightly greater than or equal to the inside diameter of mouth 102. Through this friction fit, container 12 is mounted to mandrel 92. Preferably, container 12 is mounted on mandrel 92 such that the edge of mouth 102 contacts surface 96 as shown in FIG. 2.

Extending through mandrel 92 from surface 98 to surface 94 are one or more gas outlet ports 104. In one embodiment, mandrel 92 has eight gas outlet ports 104 each having a diameter of 0.25 in. In general, the number and diameter of gas outlet ports 104 should be sufficient to prevent the differential in pressure between region 38 and region 36 from causing container 12 to be dismounted from mandrel 92 during processing of container 12. Preferably, gas outlet ports 104 are spaced evenly apart to ensure uniform gas flow.

As shown in FIG. 2, a gas nozzle 110 is connected to an end of gas inlet 40 by a gas nozzle connector 108. Gas nozzle 110 is cylindrical and can be a piece of metal tubing or other electrically conductive material. Generally, gas nozzle 110 has an inside diameter larger than the outside diameter of gas inlet 40 to allow gas inlet 40 to extend into gas nozzle 110 as shown in FIG. 2. In this embodiment, the inside diameter of gas nozzle 110 is 3/16 in. (0.188 in.) and the outside diameter of gas inlet 40 is 1/8 in. (0.125 in.).

Gas nozzle connector 108 is cylindrical and has a first section 108A with an inside diameter slightly larger than the outside diameter of gas inlet 40 and a second section 108B with an inside diameter slightly larger than the outside diameter of gas nozzle 110. In this manner, friction fits are provided between gas inlet 40 and section 108A and between gas nozzle 110 and section 108B. Through these friction fits, gas nozzle 110 is mounted to gas inlet 40. Gas nozzle connector 108 is typically made of an electrically conductive material to form an electrical connection between gas inlet 40 and gas nozzle 110. In this embodiment, gas nozzle connector 108 is made of aluminum or stainless steel.

The length B of gas nozzle 110 is generally between 2.0 in. and 6.0 in., but it can have other dimensions depending upon the particular dimensions of container 12. In general, the distance C between the end 110A of gas nozzle 110 and the bottom 12A of container 12 should be between 1.0 in. and 3.0 in. to ensure that reactive gases exiting from gas nozzle 110 reach all interior surfaces of container 12.

The arrows in FIG. 2 represent the forward flow of the second process gas during processing of container 12. In particular, the second process gas flows from gas inlet 40 through gas nozzle 110 and into region 38 proximate bottom 12A of container 12. The second process gas then flows along the length of container 12 to mandrel 92. The second process gas then flows from region 38 to region 36 through gas outlet ports 104 of mandrel 92. From region 36, gas is removed by vacuum pump 22 via pumping plenum 20 and T-coupler 24.

In this embodiment, mouth 102 of container 12 has an inside diameter of approximately 1.4 in. which fits snugly (friction fits) over lip 100 of mandrel 92. Of importance, containers with other diameter mouths can readily be processed by CISC reactor system 10. As best seen in FIG. 2, gas nozzle 110 can quickly and easily be dismounted from gas inlet 40 simply by sliding gas nozzle coupler 108 off of gas inlet 40. Next, mandrel 92 is readily dismounted from gas inlet 40 by simply sliding mandrel 92 off of gas inlet 40. This allows another mandrel having a lip corresponding in size to the new container to be slid on to gas inlet 40. Gas nozzle coupler 108 with gas nozzle 110 are then slid back on to gas inlet 40. Alternatively, another gas nozzle having a different length B could be fit into gas nozzle coupler 108, for example to accommodate a longer or shorter container.

Figure 3:
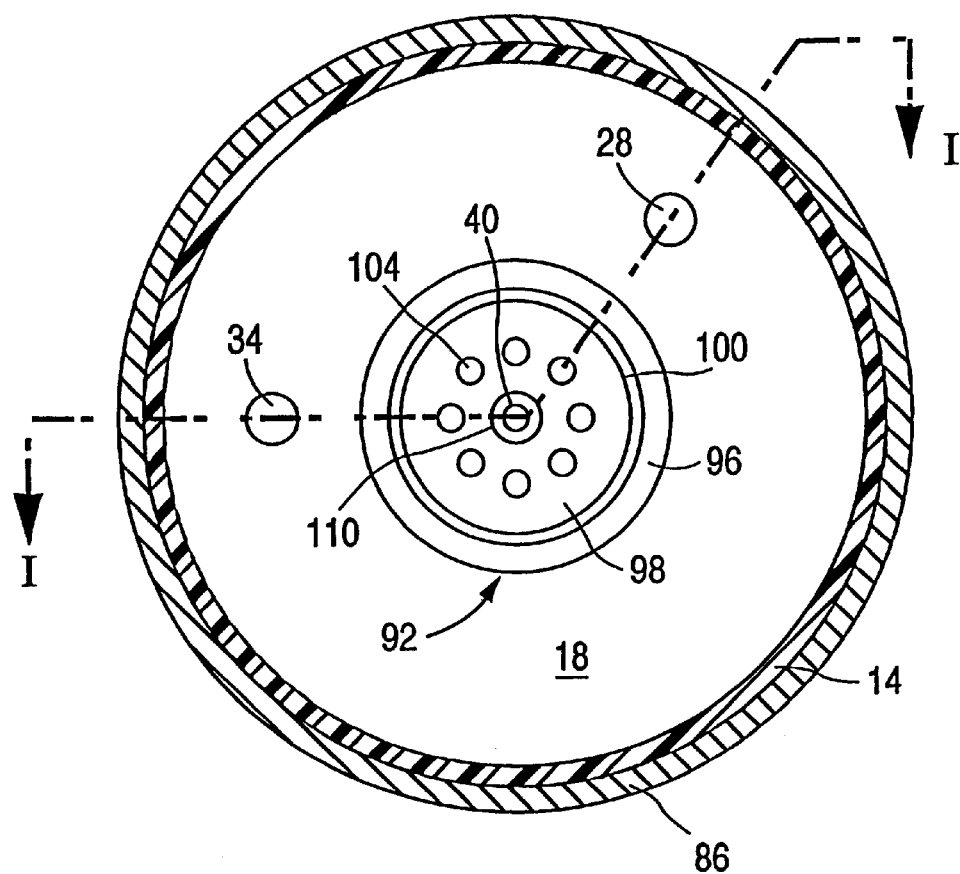
FIG. 3 is a frontal view of the chamber of FIG. 1 with the door and the container removed.

FIG. 3 is a frontal view of chamber 14 with door 16 and container 12 removed. The cross-sectional view of FIG. 1 is taken along the line I—I of FIG. 3. As shown in FIG. 3, mandrel 92, gas inlet 40 with gas nozzle 110 are located concentrically within chamber 14. Accordingly, by mounting container 12 on mandrel 92, container 12 is also located concentrically within chamber 14. The concentric geometry of CISC reactor system 10 ensures uniform power coupling and uniform gas flow thus enhancing the uniformity of the deposited thin film.

In accordance with the present invention, a method of coating the container 12, typically a polymeric container is presented. Referring back to FIG. 1, initially, chamber 14 is at atmospheric pressure and there is no container in chamber 14. Door 16 is then opened and a container 12 is mounted onto mandrel 92. Container 12 is mounted on to mandrel 92 by hand. Alternatively, chamber 14 can be oriented vertically (as opposed to horizontally as in FIG. 1) with door 16 up and container 12 can be dropped on to mandrel 92 (gravity mounted). Door 16 is then shut.

Mechanical pump 22 is then turned on to pump down chamber 14 to a subatmospheric pressure typically in the range of 0.050 torr to 1.000 torr and preferable to 0.100 torr. This subatmospheric pressure is measured by pressure transducer 26. Of importance, since chamber 14 is sized to have only a slightly larger volume than container 12, i.e. since chamber 14 has a minimum volume to be evacuated, mechanical pump 22 rapidly reduces the pressure in chamber 14 thus improving cycle time.

The first and second process gases are then introduced into chamber 14 by opening shutoff valves 47, 59 and metering valve 72. Preferably, the first and second process gases are introduced into chamber 14 when the pressure in chamber 14 reaches 0.100 torr.

The first process gas flowrate is set to between 1 standard cubic centimeter per minute (SCCM) and 1000 SCCM and preferably is set to 400 SCCM. In particular, the first process gas flowrate is set such that the chamber pressure in region 36 is within the range of 0.050 torr to 10.000 torr, preferably 0.500 torr. As discussed above, the first process gas flowrate is controlled by adjustment of metering valve 49.

The second process gas flowrate is equal to the flowrates of the first and second gas components. The first gas component flowrate is generally set to between 10 SCCM to 1000 SCCM and preferably is set to 200 SCCM. As discussed above, the first gas component flowrate is controlled by adjustment of metering valve 61.

The second gas component flowrate is generally set to between 1 SCCM to 100 SCCM and preferably is set to 20 SCCM. As discussed above, the second gas component flowrate is controlled by adjustment of metering valve 72. Generally, the ratio of the flow rates of the second gas component to the first gas component is between 1:1 and 1:100 and preferably is 1:10.

After the first and second process gas flows have stabilized (approximately 1.0 second), power supply 88 is turned on and AC power is coupled to main electrode 86 and gas inlet 40. This ionizes the gases in regions 36 and 38. If necessary, matching network 90 is adjusted to match the impedance of the power supply 88 to the impedance of the resultant process plasmas. The process power is set to between 0.1 and 5.0 watts per cubic centimeter (cc) of region 38, i.e. per the volume of container 12 in cubic centimeters. Preferably, for a 0.5 liter bottle, the process power is set to 0.25 watts/cc.

In this embodiment, the first process gas is helium, the first gas component of the second process gas is oxygen and the second gas component of the second process gas is hexamethlydisiloxane (HMDSO).

Although the present invention is not limited by any theory of operation, it is believed that the plasma generated in region 38 decomposes the HMDSO vapor breaking off the methyl groups. The oxygen oxidizes the methyl groups and any other organic groups formed thus enhancing the volatilization and gas phase removal to pump 22 of these groups. Further, the oxygen oxidizes the condensible siloxane backbone (Si—O—Si) resulting from the HMDSO decomposition to form a plasma enhanced chemical vapor deposition (PECVD) thin film of silicon oxide ($SiO_x$) on the interior surface of container 12, i.e. on the surface of container 12 in contact with region 38.

Further, since the surface area of powered gas inlet 40 with gas nozzle 110 is much less than the surface area of main electrode 86, the voltage on gas inlet 40 and gas nozzle 110 will be relatively high. This high voltage causes significant ion bombardment of gas inlet 40 and gas nozzle 110, thus essentially eliminating any coating deposition on gas inlet 40 or gas nozzle 110. This advantageously increases the number of containers which can be coated before CISC reactor system 10 must be serviced.

Further, the significant ion bombardment causes gas inlet 40 and gas nozzle 110 to become heated. This heats the interior surface of container 12 which densifies the deposited coating and enhances the barrier properties of the deposited coating.

Further, the high voltage on gas inlet 40 and gas nozzle 110 causes both the first and second gas components of the second process gas to be ionized simultaneously inside of gas nozzle 110 before being discharged to and further ionized in region 38 outside of gas nozzle 110. This causes the second process gas to be highly activated (to have a high degree of ionization) throughout region 38 thus enhancing the uniformity of the coating deposited on the interior surface of container 12.

After a predetermined amount of time, generally 1 to 300 seconds and typically 5 to 15 seconds, power supply 88, the first and second process gas flows and mechanical pump 22 are shut off. To shut off the first and second process gases, shutoff valves 47, 59 and metering valve 72 are closed. It is understood that the organosilicon liquid in capillary tube 70 may be completely vaporized before metering valve 72 is closed and thus the flow of the organosilicon vapor may have ceased before metering valve 72 is closed. Chamber 14 is then vented to atmospheric pressure by opening vent valve 30.

When chamber 14 reaches atmospheric pressure as measured by pressure transducer 26, door 16 is opened. Ejection shutoff valve 82 is then opened thus providing a blast of compressed gas through gas inlet 40. This blast of compressed gas ejects container 12 from mandrel 92. This blast of compressed gas also serves to remove any particulates from the interior of gas inlet 40 and gas nozzle 110 essentially eliminating any pinhole or other particulate defects of the barrier coating deposited on the interior surface of the succeeding container. At this point, a new container is loaded on to mandrel 92 and processed.

Figure 4:
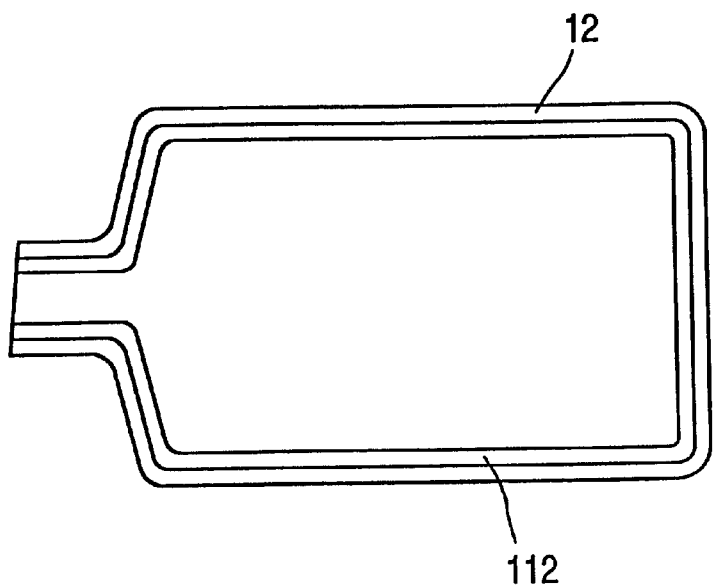
FIG. 4 is a cross-sectional view of the container having a barrier coating deposited on the interior surface of the container in accordance with the present invention.

FIG. 4 is a cross-sectional view of container 12 having a barrier coating 112 deposited on the interior surface of container 12 in accordance with the present invention. By depositing barrier coating 112 on the interior surface of container 12, abrasion of barrier coating 112 during handling and shipment is essentially eliminated in contrast to a barrier coating formed on the exterior surface of container 12. Further, in the case of highly sensitive products, forming barrier coating 112 on the interior surface of container 12 prevents degradation of the product from direct interactions between the product and container 12. (Conversely, a barrier coating on the exterior surface of container 12 offers no protection from direct interaction between the product and container 12.)

In this embodiment where the organosilicon liquid is HMDSO and the first component of the second process gas is oxygen, the resultant barrier coating 112 is primarily a silicon oxide ($SiO_x$) thin film which typically contains a small percentage of carbon and/or hydrogen. However, in other embodiments, nitrogen or fluorine can be incorporated into barrier coating 112 for example by using a nitrogen containing organosilicon liquid such as hexamethydisilazane or a fluorine containing organosilicon liquid such as trimethyfluorosilane, respectively.

Alternatively, instead of using an organosilicon liquid, source 52 (FIG. 1) can be a hydrocarbon such as methane or propane. In this alternative, the resultant barrier coating 112 (FIG. 4) is a thin film primarily containing carbon. As another alternative, source 52 (FIG. 1) can be an organometallic such as tetramethyltin. In this alternative, the resultant barrier coating 112 (FIG. 4) is a metal containing thin film.

Further, in other embodiments, the first gas component of the second process gas can be a gas other than oxygen. Generally, the first gas component of the second process gas is a reactive gas. For example, the first gas component is a fluorine-based compound such as carbon tetrafluoride ($CF_4$). Examples of other suitable fluorine-based compounds include: aliphatic fluorohydrocarbons such as perfluorotetradecane; aromatic fluorohydrocarbons such as fluorobenzene; benzotrifluorides such as 3-(trifluoromethyl)benzyl alcohol; fluroalkenes/alkynes such as hexafluoropropene trimer; (Meth)acrylate monomers such as hexafluoroisopropyl acrylate; fluoroalcohols and phenols such as hexafluoroisopropanol; fluorine-containing ethers such as trifluoromethoxy benzene; fluorine-containing ketones such as hexafluoroacetone; fluoroacids and anhydrides such as difluoroacetic acid; fluoroaldehydes such as pentafluorobenzaldehyde; fluoroesters such as ethyl trifluoroacetate; fluorine containing nitriles such as pentafluorobenzonitrile; inorganic fluorine compounds such as silver fluoride; and fluorine-containing silanes such as trimethylfluorosilane.

Further, the first gas component of the second process gas can be another gas such as nitrogen ($N_2$), nitrous oxide ($N_2O$) or an organometallic such as tetramethyltin. Further, the first gas component can itself be a gas mixture, for example can be a mixture of nitrous oxide and oxygen.

As these and other variations and combinations of the features discussed above can be utilized without departing from the present invention, the foregoing description of the preferred embodiments should be taken by way of illustration rather than by way of limitation of the present invention as defined by the claims. The following examples are intended to further illustrate the invention, but not to limit it.

In the following examples 1, 2, 3 and 4, a 0.5 liter nominal volume bottle formed from polyethylene terepthalate (PET) by injection blow molding is treated. The untreated PET bottle has an oxygen transmission rate of 0.126 cc/bottle/day. All oxygen transmission rates (before and after treatment) are measured at 23 degrees celsius and 50% relative humidity (RH) outside of the bottle and with atmospheric pressure air (oxygen at 0.21 atmosphere) at 80% RH inside of the bottle. The first process gas is helium. The first and second gas components of the second process gas are oxygen and HMDSO, respectively.

EXAMPLE 1

The distance C (see FIG. 2) between the edge 110A of gas nozzle 110 and the bottom 12A of container 12 is 1.0 in. Helium, oxygen and HMDSO are supplied at flow rates of 400 SCCM, 200 SCCM and 25 SCCM, respectively. The pressure in region 36 (see FIG. 1) is maintained at approximately 1.000 torr. The gases in regions 36 and 38 are ionized for 30 seconds by applying 150 watts of RF power from power supply 88 to main electrode 86 and gas inlet 40 to deposit a thin silicon oxide coating on the interior surface of container 12. The bottle is not rotated or otherwise manipulated.

After deposition of the thin silicon oxide coating, the oxygen transmission rate was reduced to 0.052 cc/bottle/day.

EXAMPLE 2

The distance C (see FIG. 2) between the edge 110A of gas nozzle 110 and the bottom 12A of container 12 is 1.0 in.

Oxygen and HMDSO are supplied at flow rates of 200 SCCM and 25 SCCM, respectively. There is no helium supplied. The pressure in region 36 (see FIG. 1) is maintained at approximately 0.300 torr. The gases in regions 36 and 38 are ionized for 30 seconds by applying 250 watts of RF power from power supply 88 to main electrode 86 and gas inlet 40 to deposit a thin silicon oxide coating on the interior surface of container 12. (The gas in region 36 comprises reacted and unreacted process gas from region 38.) The bottle is not rotated or otherwise manipulated.

After deposition of the thin silicon oxide coating, the oxygen transmission rate was reduced to 0.076 cc/bottle/day.

EXAMPLE 3

Example 2 was repeated with the exceptions that the oxygen, HMDSO and helium flowrates were changed to 120 SCCM, 50 SCCM and 200 SCCM respectively. The oxygen transmission rate was reduced to 0.054 cc/bottle/day.

EXAMPLE 4

The distance C (see FIG. 2) between the edge 110A of gas nozzle 110 and the bottom 12A of container 12 is 1.0 in. Helium, oxygen and HMDSO are supplied at flow rates of 400 SCCM, 200 SCCM and 50 SCCM, respectively. The pressure in region 36 (see FIG. 1) is maintained at approximately 1.000 torr. The process gases in regions 36 and 38 are ionized for 60 seconds by applying 150 watts of RF power from power supply 88 to main electrode 86 and gas inlet 40 to deposit a thin silicon oxide coating on the interior surface of container 12. The bottle is not rotated or otherwise manipulated.

The distance C (the gas nozzle position, see FIG. 2) was adjusted to 0.5 in., 1.5 in. and 2.0 in. and this experiment was repeated for each gas nozzle position. The thicknesses of the resulting thin silicon oxide coatings deposited was measured for each gas nozzle position using conventional x-ray fluorescence (XRF) techniques.

Table 1 is the measured thin silicon oxide coating thicknesses for various gas nozzle positions.

TABLE 1

| Distance | Thickness (Angstroms) | | | | | |
| --- | --- | --- | --- | --- | --- | --- |
| C (in.) | Bottom | Middle | Top | Cap | Average | Uniformity |
| 0.5 | 162 | 99 | 129 | 119 | 127 | 21% |
| 1.0 | 300 | 297 | 221 | 146 | 241 | 30% |
| 1.5 | 472 | 386 | 314 | 213 | 346 | 32% |
| 2.0 | 196 | 249 | 366 | 148 | 239 | 39% |

Referring to container 12 in FIG. 2, bottom refers to section 12A, middle refers to section 12B, top refers to section 12C and cap refers to the portion 12D of mouth 102 which does not contact mandrel 92. Uniformity in Table 1 equals the standard deviation (not shown in Table 1) divided by the average thickness. As shown in Table 1, good uniformity (21%–39%) is obtained without the necessity of rotating or otherwise manipulating the bottles.

EXAMPLE 5

In this example, a high density polyethylene (HDPE) wide mouth bottle available from Cole Parmer as Part # 62201-06 is treated. The untreated HDPE bottle has an oxygen transmission rate of 8.47 cc/bottle/day. All oxygen transmission rates (before and after treatment) are measured at 23 degrees celsius and 50% relative humidity (RH) outside of the bottle and with atmospheric pressure air (oxygen at 0.21 atmosphere) at 75% RH inside of the bottle. No first process gas is used. The first and second gas components of the second process gas are oxygen and 1, 1, 3, 3-tetramethyldisiloxane (TMDSO), respectively.

A 4.25 in. gas nozzle 110 (see FIG. 2) is used. Oxygen and TMDSO are both supplied at flow rates of 50 SCCM. The process gas is ionized for 2.5 minutes by applying 200 watts of RF power from power supply 88 to main electrode 86 and gas inlet 40 to deposit a thin silicon oxide coating on the interior surface of the HDPE bottle. The bottle is not rotated or otherwise manipulated.

After deposition of the thin silicon oxide coating, the oxygen transmission rate was reduced to 1.16 cc\bottle\day.

Although the present invention has been described with reference to preferred embodiments, persons skilled in the art will recognize that changes may be made in form and detail without departing from the spirit and scope of the invention. For example, the invention can be used to deposit a coating on other three dimensional objects made of a variety of materials, for example can be used to deposit a coating on a metallic beverage can.

Further, although the coating is described as being deposited on the interior surface of a container, the invention can also be used to deposit a coating on the exterior surface of a container. For example, instead of being a low mass high ionization potential gas such as helium, the first process gas can be a process gas mixture containing an organosilicon. Alternatively, instead of mounting the container on the mandrel and feeding the second process gas to the interior of the container, the container can be mounted such that the second process gas is fed to the exterior surface of the container.

Referring back to FIG. 1, in one embodiment a second gas inlet 120, typically a metal tube, extends through an electrically insulating vacuum feedthrough (not shown) in door 16 and into region 36. Second gas inlet 120 is coupled to a separate process gas system (not shown) or alternatively can be coupled (not shown) to the gas system which feeds gas inlet 40, i.e. to sources 52 and 54. Further, as shown in FIG. 1, second gas inlet 120 can be electrically coupled to gas inlet 40 and power supply 88, thus functioning as a second counter electrode for power supply 88.

By introducing a source process gas, such as an organosilicon containing gas, through second gas inlet 120 into region 36, and ionizing the source process gas, a deposited coating is formed on the exterior surface of container 12. The deposited coating on the exterior surface of container 12 can be formed simultaneously with the deposited coating on the inside of container 12 by introducing source gases through gas inlets 40 and 120 simultaneously. Alternatively, a source gas is introduced only through second gas inlet 120 and a deposited coating is formed only on the exterior surface of container 12.

Further, a deposited coating in accordance with this invention can be used in a variety of applications. Examples of applications include gas, vapor and aroma barriers, corrosion resistance, abrasion resistance and lubricity.

Thus, the invention is limited only by the following claims.

I claim:

1. A method for depositing a coating on an interior surface of a container comprising:

mounting said container in a vacuum chamber made of an electrically insulating material;

evacuating said vacuum chamber to a subatmospheric pressure;

introducing a process gas into said vacuum chamber into a first region inside of said container through a gas inlet, wherein said process gas flows from said first region to a second region outside of said container; and ionizing said process gas by coupling alternating current (AC) power to a main electrode adjacent an exterior surface of said vacuum chamber and to said gas inlet to deposit said coating on said interior surface of said container, said coating being formed from said process gas.

2. The method of claim 1 wherein said mounting comprises mounting said container on a mandrel mounted on said gas inlet.

3. The method of claim 2 wherein said mandrel has at least one gas outlet port thereby allowing said process gas to flow from said first region to said second region.

4. The method of claim 1 wherein said subatmospheric pressure is within the range of 0.050 torr to 1.000 torr.

5. The method of claim 4 wherein said subatmospheric pressure is 0.100 torr.

6. The method of claim 1 wherein said process gas is a gas mixture comprising a first gas component and an organosilicon vapor.

7. The method of claim 6 wherein said first gas component is oxygen.

8. The method of claim 1 wherein said process gas is a first process gas, said method further comprising introducing a second process gas into said second region.

9. The method of claim 8 wherein said second process gas is helium.

10. The method of claim 1 wherein said container has a volume, the amount of AC power coupled during said ionizing being between 0.1 watts per cubic centimeters (cc) of said volume and 5.0 watts per cc of said volume.

11. The method of claim 1 wherein said ionizing is performed for an amount of time in the range of 1 to 300 seconds.

12. The method of claim 1 further comprising, subsequent to said ionizing:
venting said vacuum chamber to atmospheric pressure; and
removing said container from said vacuum chamber.

13. A method for depositing a coating on an interior surface of a container comprising:
mounting said container in a vacuum chamber made of an electrically insulating material;
evacuating said vacuum chamber to a subatmospheric pressure;
introducing a first process gas into said vacuum chamber into a first region outside of said container;
introducing a second process gas into said vacuum chamber into a second region interior of said container through a gas inlet; and
ionizing said first process gas and said second process gas by coupling alternating current (AC) power to a main electrode adjacent an exterior surface of said vacuum chamber and to said gas inlet to deposit said coating on said interior surface of said container, said coating being formed from said second process gas.

14. The method of claim 13 wherein said mounting comprises mounting said container on a mandrel mounted on said gas inlet.

15. The method of claim 14 wherein said mandrel has at least one gas outlet port thereby allowing said second process gas to flow from said second region to said first region.

16. The method of claim 13 wherein said subatmospheric pressure is within the range of 0.050 torr to 1.000 torr.

17. The method of claim 16 wherein said subatmospheric pressure is 0.100 torr.

18. The method of claim 13 wherein said first process gas is helium.

19. The method of claim 13 wherein said second process gas is a gas mixture comprising a first gas component and an organosilicon vapor.

20. The method of claim 19 wherein said first gas component is oxygen.

21. The method of claim 13 wherein said container has a volume, the amount of AC power coupled during said ionizing being between 0.1 watts per cubic centimeters (cc) of said volume and 5.0 watts per cc of said volume.

22. The method of claim 13 wherein said ionizing is performed for an amount of time in the range of 1 to 300 seconds.

23. The method of claim 13 further comprising, subsequent to said ionizing:
venting said vacuum chamber to atmospheric pressure; and
removing said container from said vacuum chamber.

24. A method for depositing a coating on an exterior surface of a container comprising:
mounting said container in a vacuum chamber made of an electrically insulating material;
evacuating said vacuum chamber to a subatmospheric pressure;
introducing a process gas into said vacuum chamber into a first region outside of said container through a first gas inlet; and
ionizing said process gas by coupling alternating current (AC) power to a main electrode adjacent an exterior surface of said vacuum chamber and to a counter electrode inside of said vacuum chamber to deposit said coating on said exterior surface of said container, said coating being formed from said process gas.

* * * * *